United States Patent
Mashimo et al.

[11] Patent Number: 5,261,966
[45] Date of Patent: Nov. 16, 1993

[54] METHOD OF CLEANING SEMICONDUCTOR WAFERS USING MIXER CONTAINING A BUNDLE OF GAS PERMEABLE HOLLOW YARNS

[75] Inventors: Noriyoshi Mashimo, Tokyo; Katsuya Okumura, Yokohama, both of Japan

[73] Assignee: Kabushiki Kaisha Toshiba, Kawasaki, Japan

[21] Appl. No.: 825,589

[22] Filed: Jan. 24, 1992

[30] Foreign Application Priority Data

Jan. 28, 1991 [JP] Japan .................. 3-26800

[51] Int. Cl.$^5$ .................. B08B 3/08; C23G 1/02
[52] U.S. Cl. .................. 134/2; 134/3; 134/26; 134/31; 134/36
[58] Field of Search .................. 134/2, 3, 25.4, 26, 134/28, 31, 36, 42; 261/94, DIG. 72

[56] References Cited

U.S. PATENT DOCUMENTS 4,552,783 11/1985 Stoll et al. .................. 134/3
4,673,443 6/1987 Fetty .
4,778,532 10/1988 McConnell et al. .

FOREIGN PATENT DOCUMENTS 2164035 6/1990 Japan .
232227 10/1991 Japan .

OTHER PUBLICATIONS

Patent Abstracts of Japan, vol. 14, No. 425 (E-977) Sep. 1990 & JP-A-2 164 035 (NEC Corp) Jun. 25, 1990.

*Primary Examiner*—Theodore Morris
*Assistant Examiner*—Saeed T. Chaudhry
*Attorney, Agent, or Firm*—Finnegan, Henderson, Farabow, Garrett & Dunner

[57] ABSTRACT

For cleaning semiconductor wafers in a cleaning vessel by supplying a cleaning fluid through a supply line thereto, a mixer is provided. Deionized water is supplied to the mixer through a deionized water supply line, and a cleaning gas is supplied thereto from a gas reservoir to produce the cleaning fluid. After treating the semiconductor wafers with the cleaning fluid, the deionized water is supplied to the cleaning vessel to rinse them.

8 Claims, 5 Drawing Sheets

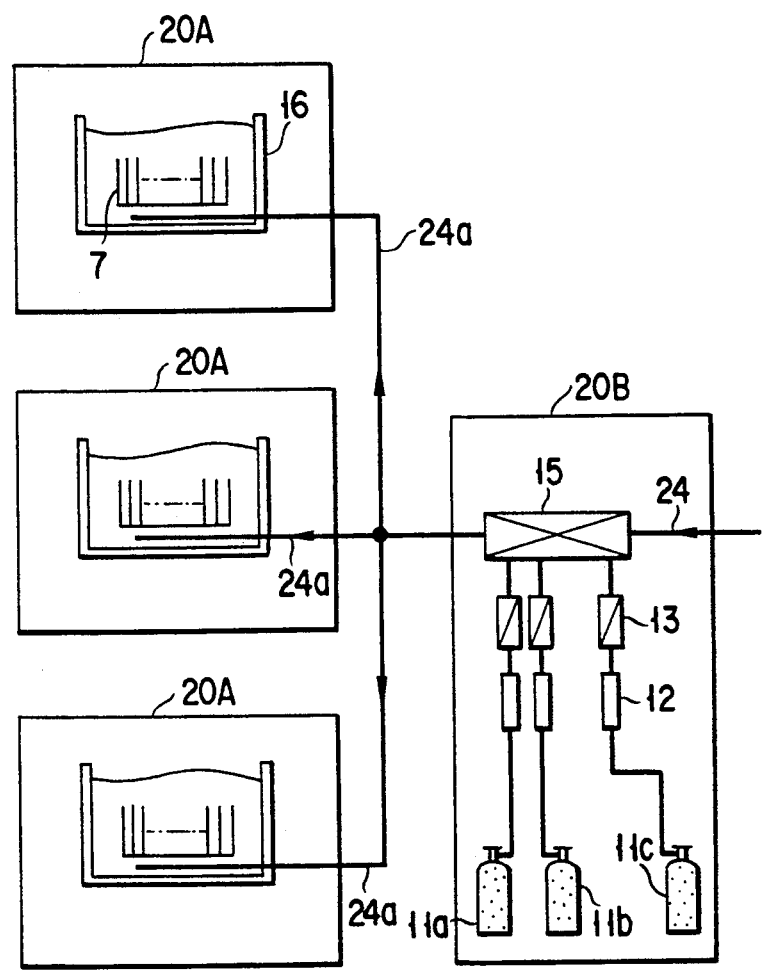
F I G. 4

METHOD OF CLEANING SEMICONDUCTOR WAFERS USING MIXER CONTAINING A BUNDLE OF GAS PERMEABLE HOLLOW YARNS

BACKGROUND OF THE INVENTION

1. Field of the Invention

The present invention relates to a method and an arrangement, both for cleaning semiconductor wafers, and more particularly to a method and an arrangement for removing unwanted metal impurities and particles from the surfaces of semiconductor wafers.

2. Description of the Related Art

Pattern defects resulting from unwanted metal impurities or particles adhered to semiconductor wafers are the most prominent of the defectives of VLSI (Very-Large-Scale Integrated) circuits Since particles adhere to the wafers during the steps of the manufacturing process, such as sputtering, ion-implantation, and plasma CVD, the wafers must be alternately treated by combining different kinds of cleaning fluids and deionized water in accordance with the kind of the particles caused in respective steps Further, it has been performed to remove a natural oxide film from the wafer surface or to activate the wafer surface.

FIG. 5 shows a conventional cleaning arrangement In the FIGURE, 1 is a fluid reservoir for placing a process fluid containing desired chemicals, 2 is a pump for pumping the process fluid from the fluid reservoir 1, 3 is a filter, 4 is a measuring/mixing tank for measuring the pumped process fluid and deionized water supplied through a deionized water supply line 5 and mixing them to prepare a cleaning fluid, 6 is a cleaning vessel for treating semiconductor wafers, and 8 is a supply line for supplying deionized water for rinse, respectively.

In the cleaning method performed by the cleaning arrangement shown in FIG. 5, the fluid reservoir 1 filled with the process fluid is connected to the process fluid supply line which is located remote from the cleaning arrangement Next, the process fluid is supplied by the pump 2 to the measuring/mixing tank 4 through the filter 3 until a level sensor (not shown) connected to the tank 4 indicates that the surface of the process fluid in the tank 4 reaches a predetermined level. Similarly, the deionized water is supplied to the measuring/mixing tank 4 through deionized water supply line 5 until the surface of the fluid in the tank 4 reaches a predetermined level In the tank 4, the process fluid and the deionized water are mixed to prepare a cleaning fluid. One of the cleaning fluids is supplied to the cleaning vessel 6 in turn, thereby treating the semiconductor wafers therewith. Thereafter, the semiconductor wafers 7 are rinsed with the deionized water supplied from the line 8.

However, the conventional cleaning arrangement and the conventional cleaning method have the following problems:

(a) Since the process fluid is carried after the reservoir is filled therewith, unwanted metal impurities and particles are dissolved in the process fluid from the reservoir. Therefore, a high purity process fluid can not be obtained.

(b) Since the process fluid is an aqueous solution of chemicals, it is necessary to frequently exchange process fluid reservoirs with one another. Therefore, the impurity contamination may occur from the external atmosphere, depending upon the frequencies of exchanging the reservoirs. Further, much care is necessary to maintain the safety of working.

(c) Since it is necessary to locate the reservoirs at the position remote from the cleaning arrangement, the length of piping may inevitably become long and be complicated. Therefore, when the process fluid is handled and the reservoirs are frequently exchanged, the chance of leakage of the process fluid and the chance of intrusion of unwanted contaminants may be increased in the piping. Consequently, it may be difficult to prepare a high purity process fluid.

(d) Due to the facts (a) to (c), it is not easy to change the composition of the process fluid. Although the process fluid is measured by the level sensor, it is difficult to accurately control the composition of the process fluid due to the length of piping.

There has been proposed a cleaning technique such that after supplying deionized water and a cleaning gas to a cleaning vessel to provide a cleaning fluid, semiconductor wafers are cleaned with the cleaning fluid.

FIG. 6 shows such a method which is disclosed in Published Unexamined Japanese Patent Application No. 2-164035. In FIG. 6, 1 is a reservoir 1 for deionized water, 2 is a heater, 3 is an ozone generator, 4 is a pump, 5 is a filter, 6 is a cleaning vessel, 7 is a gas supply unit 7, and 8 is a filter.

Semiconductor wafers are cleaned by the method in the following manner.

The ozone introduced into the reservoir 1 is partly dissolved in the deionized water contained in the reservoir 1 to produce ozone-containing deionized water. The ozone-containing deionized water is supplied to the cleaning vessel 6 through the filter 5. Meanwhile, ammonia gas, hydrogen chloride gas, or nitrogen dioxide gas is supplied to the cleaning vessel 6 through the filter 8 from the gas supply unit 7. Using such a cleaning fluid, semiconductor wafers are cleaned, thereby preventing unwanted particles from adhering to the surfaces of the wafers, and preventing unwanted impurities from contaminating the surfaces of the wafers.

The cleaning method, however, has the following problems:

(a') When the ammonia gas is used as the cleaning gas, ammonia water, which acts as a cleaning agent, cannot be uniformly dissolved in the deionized water in the cleaning vessel 6. In other words, it is difficult to obtain a cleaning fluid having a predetermined concentration of the process fluid. Further, it is impossible to control the concentration of the process fluid in the cleaning fluid correctly.

(b') Semiconductor wafers cannot be continuously treated with cleaning fluids each containing a different process fluid.

(c') Even if the process fluid remained in the previous step is removed, it is difficult to maintain the deionized water clean in the cleaning vessel.

(d') An agitator or a bubbler needs to be used to dissolve ammonia water (i.e., cleaning agent) uniformly in the deionized water. It may be undesirable, however, that rotational members such as the agitator be located within the cleaning vessel.

SUMMARY OF THE INVENTION

Accordingly, it is an object of the invention to provide an improved method of cleaning semiconductor wafers.

Another object of the invention is to provide a method of cleaning semiconductor wafers by alternately and continuously applying at least one process fluid and deionized water to a cleaning vessel in a specific order.

Still another object of the invention is to provide a method of cleaning semiconductor wafers by preparing a cleaning fluid having a uniform concentration of process fluid.

Another object of the invention is to provide a method of cleaning semiconductor wafers by a cleaning fluid capable of controlling a concentration of a process fluid.

Further, another object of the invention is to provide a method of cleaning semiconductor wafers, wherein adhesion of metal impurities or particles to the semiconductor wafers is reduced.

Moreover, it is an object of the present invention to provide an arrangement for performing the cleaning method described above.

According to an aspect of the invention, there is provided a method for cleaning semiconductor wafers, which comprises the steps of:

placing a plurality of semiconductor wafers in a cleaning vessel;

supplying deionized water to the mixer through a deionized water supply line, while supplying a cleaning gas thereto from a gas reservoir, thereby providing a cleaning fluid; and supplying the cleaning fluid to the cleaning vessel through a supply line.

In this case, the cleaning gas is dissolved in the deionized water by the mixer.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

FIG. 4 is a diagram schematically showing an arrangement for cleaning semiconductor wafers according to a third embodiment of the invention;

DETAILED DESCRIPTION OF THE PREFERRED EMBODIMENTS

Embodiments of the present invention will now be described with reference to the accompanying drawings.

Figure 1:
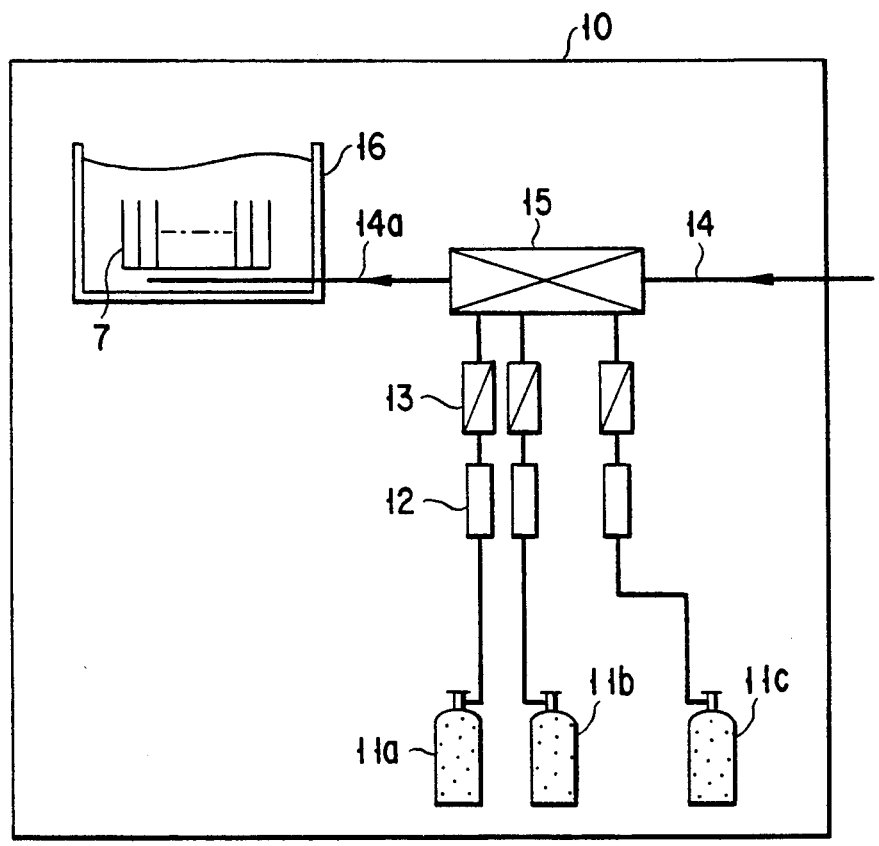
FIG. 1 is a diagram schematically showing an arrangement for cleaning semiconductor wafers according to a first embodiment of the invention.

FIG. 1 shows a cleaning arrangement a first embodiment in which a cleaning fluid is prepared and semiconductor wafers are cleaned therewith.

In FIG. 1, 11a, 11b, and 11c are pressure resisting reservoirs for receiving a hydrogen fluoride (boiling point 19.5° C.), a hydrochloric acid gas, and an ammonia gas, respectively, 12 denotes mass-flow controller, and 13 designates an adsorption filter or gas refiner. The components 11a to 13 are located within the cleaning arrangement 10. In FIG. 1, 14 is a deionized water supply line. A mixer 15 is connected to the deionized water supply line 14. The mixer 15 comprises a number of hollow yarns (fibers) made of a gas permeable material such as fluorine resins. The hollow yarns permeate the hydrogen fluoride gas, but not permeate the deionized water. The hydrogen fluoride gas fed from the reservoir 11a and kept at a predetermined pressure is dissolved in the deionized water flowing through the hollow yarns, thereby producing a hydrofluoric acid having a desired concentration. The process fluid, i.e. the cleaning fluid is rendered to a supply line 14a. Since the hydrofluoric acid concentration of the cleaning fluid depends upon the flow rate of the deionized water and that of the hydrogen fluoride gas, the controllability of the hydrofluoric acid concentration will be greatly increased. Since the mixing process is performed automatically in a closed system, the unwanted particles and impurities will not be added to the cleaning fluid. The line 14a is directly connected to a cleaning vessel 16 as is shown in FIG. 1, and an extremely thin oxide film (natural oxide film) is removed by the hydrofluric acid from surface of each semiconductor wafer 7. After finishing the cleaning of each wafer 7, the mass-flow controller 12 is operated to stop the supply of the hydrogen fluoride gas to the cleaning vessel 16, and the deionized water is immediately supplied through the line 14a to rinse the semiconductor wafers 7 therewith.

If the hydrochloric acid gas is supplied to the mixer 15 from the reservoir 11b, a process fluid containing hydrochloric acid is supplied to the cleaning vessel 16 through the fluid supply line 14a. As a result, unwanted Fe particles are removed from the surfaces of each semiconductor wafer 7.

Further, if the ammonia gas is supplied to the mixer 15 from the reservoir 11c, ammonia water is supplied to the cleaning vessel 16 to rinse the semiconductor wafers 7 therewith.

As has been described, it will be apparent that semiconductor wafers 7 are continuously subjected to the cleaning processes, for example, which include the cleaning process using the hydrofluoric acid, the rinsing process using the deionized water, the cleaning process using the hydrochloric acid and the rinsing process using the deionized water.

Figure 2A:
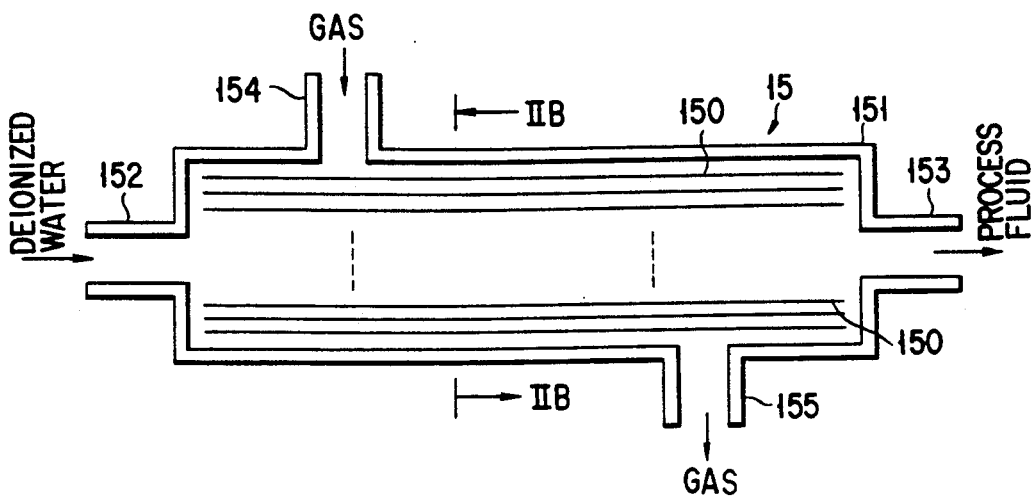
FIG. 2A is a cross-sectional view schematically showing a mixer incorporated in the arrangement of FIG. 1 and comprised of a number of hollow yarns (fibers)
Figure 2B:
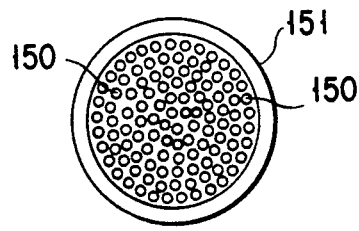
FIG. 2B is a sectional view, taken along line IIB—IIB in FIG. 2A.

FIGS. 2A and 2B schematically show the mixer 15 used in the present invention. As is evident from FIGS. 2A and 2B, the mixer 15 includes a bundle of gaspermeable hollow yarns 150 and a case 151 for receiving the hollow yarns 150. The case 152 has an inlet port 152 for deionized water, an outlet port 153 for process fluid, a gas inlet port 154, and a gas outlet port 155. The deionized water is supplied to the mixer 15 through the inlet port 152, and the hydrogen fluoride gas is introduced into the mixer 15 through the gas inlet port 154, whereby the process fluid is produced and supplied to the cleaning vessel 16.

Figure 2C:
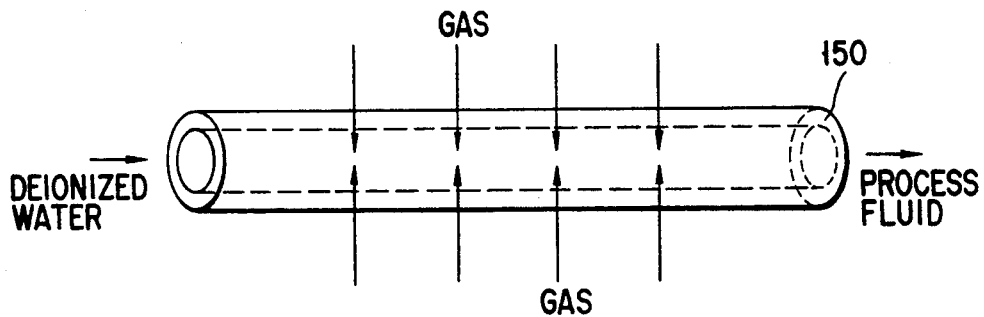
FIG. 2C is an enlarged view showing one of the hollow yarns used in the mixer of FIG. 2A.

FIG. 2C is an enlarged view of one of the hollow yarns 150 of the mixer 15, and explaining how the gas introduced into the hollow yarn 150 is dissolved in the deionized water. That is, the introduced gas permeates the hollow yarn 150 and is dissolved in the deionized water to produce the process fluid.

Figure 3:
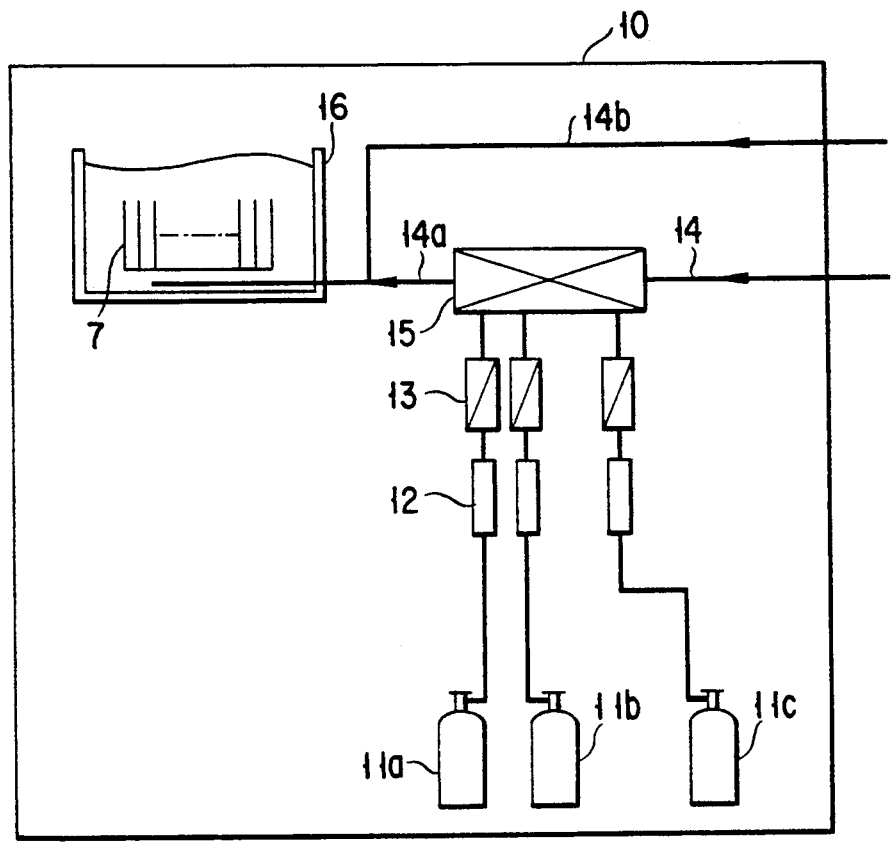
FIG. 3 is a diagram schematically representing an arrangement for cleaning semiconductor wafers according to a second embodiment of the invention.
Figure 5:
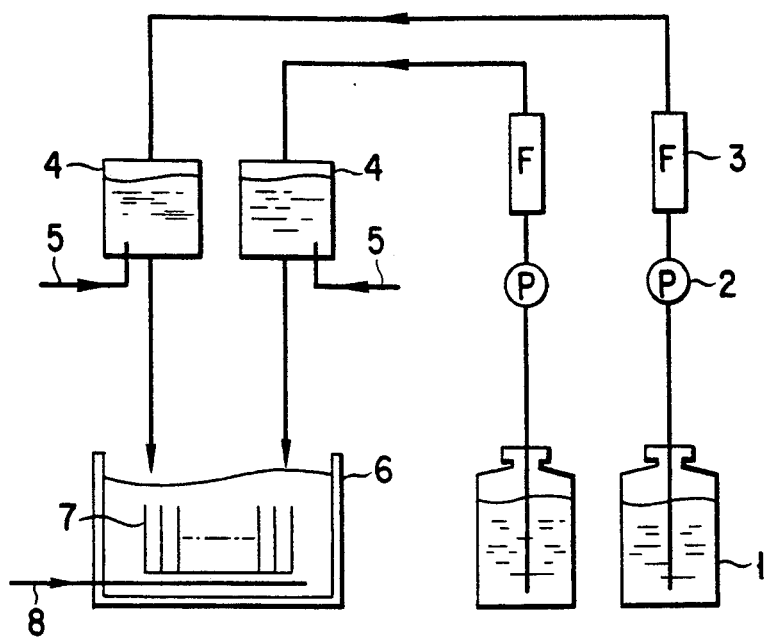
FIG. 5 is a diagram schematically illustrating a conventional arrangement for cleaning semiconductor wafers.
Figure 6:
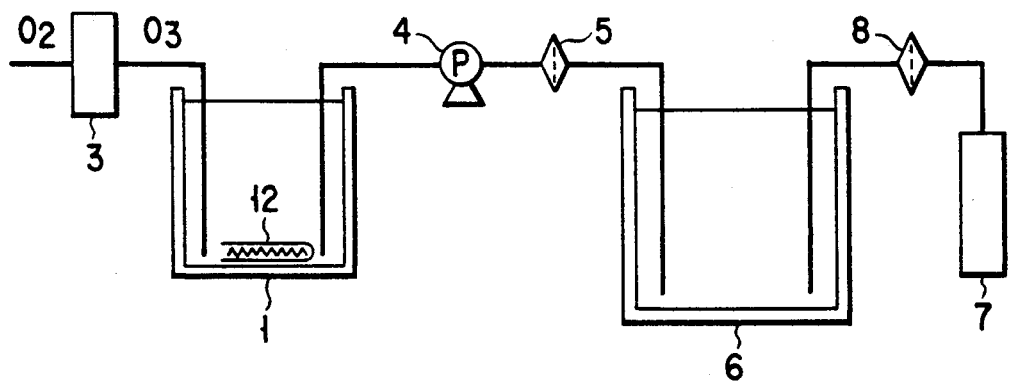
FIG. 6 is a diagram schematically illustrating another conventional arrangement for cleaning semiconductor wafers.

FIG. 3 shows a second embodiment of the invention. In FIG. 3, 14b is a deionized water supply line separated from the deionized water supplying line 14. The line 14b is coupled to the supply line 14a connected to the cleaning vessel 16. Therefore, the process fluid concentration can be easily controlled without changing the condition of the gas dissolution in the mixer 15. Further, the semiconductor wafers can be easily rinsed.

FIG. 4 shows a cleaning arrangement according to a third embodiment of the invention. The arrangement includes three cleaning units 20A, one gas-mixing unit 20B, a deionized water supply line 24 for supplying deionized water to the gas-mixing unit 20B, and a multi-way supply line 24a for connecting the gas-mixing unit 20B to the cleaning units 20A. Each cleaning unit 20A includes the cleaning vessel 16 and other components associated with the vessel 16. The gas-mixing unit 20B includes the pressure resisting reservoirs 11a, 11b and 12c, the mass-flow controllers 12, the adsorption filters or gas refiners 13, and the mixer 15. Therefore, semiconductor wafers 7 are cleaned in the same manner as in the first embodiment. Since the supply line 24a is sufficiently short, unwanted particles can be prevented from mixing in the process fluid, as compared to the arrangement shown in FIG. 1.

Using the arrangement of FIG. 4, when the process fluid supplied to the cleaning vessels was investigated, the controllability of the process fluid concentration was improved, and the unwanted particles and impurities in the process fluid were greatly reduced as compared to the prior art as shown in Table 1.

TABLE 1

|  | Prior Art | Present Invention |
| --- | --- | --- |
| Concentration Control in process fluid | ±3.0% | ±0.05% |
| Particles in process fluid [0.1 μm or more] | 120/cc | 10/cc |
| Metal Impurities in process fluid | 0.1 ppb | 0.005 ppb |

Further, Table 2 shows results of the uniformity of etching and the surface cleanliness factor as compared to the prior art when the semiconductor wafers are subjected to etching and cleaning by using the high purity process fluid.

TABLE 2

|  | Prior Art | Present Invention |
| --- | --- | --- |
| Uniformity of SiO$_2$ Etching | ±1.0% | ±0.05% |
| Surface cleanliness factor after acid cleaning |  | 10/cc |
| 1) Particles [0.1 μm or more] | 100.6φ wafer | 10/6φ wafer |
| 2) Metal (Fe) Impurity | 2 × 10$^{10}$ atoms/cm$^2$ | 4 × 10$^9$ atoms/cm$^2$ |
| 3) Metal (Cu) Impurity | 1 × 10$^{10}$ atoms/cm$^2$ | 1 × 10$^9$ atoms/cm$^2$ |

The mixer provided by the hollow yarns has been used in the embodiments. However, any other means such as gas-liquid contact means using a nozzle may be employed.

In the embodiments described above, semiconductor wafers are treated with two fluids, i.e., the process fluid of the hydrofluoric acid and the deionized water. However, second and third reservoirs 11b and 11c can be connected to the mixer through gas supply lines, and HCl, Cl$_2$, F$_2$, NH$_3$, SO$_2$, O$_3$, N$_2$O$_4$, and the like can be alternately supplied thereto to clean or modify the surfaces of the semiconductor wafers.

According to the present invention, the mixer and the cleaning vessel are separately arranged, and the cleaning gas for the wafer surface is mixed with the deionized water to produce the process fluid. Thereafter, the process fluid is supplied to the cleaning vessel. Therefore, the semiconductor wafers will be prevented from the adhesion of unwanted particles to the wafer surfaces and from the contamination of unwanted impurities due to the cleaning fluid. In addition, it will be easy to exchange the process fluids, and the cleaning process using the cleaning fluid and the rinsing process will be continuously accomplished to provide the cleaning method and its arrangement suitable for use in manufacturing VLSI devices.

It is further understood by those skilled in the art that the foregoing description is only of the preferred embodiments and that various changes and modifications may be made in the invention without departing from the spirit and scope thereof.

What is claimed is:

1. A method for cleaning semiconductor wafers comprising the steps of:
   placing a plurality of semiconductor wafers in a cleaning vessel;
   supplying deionized water through a deionized water supply line to a mixer including a bundle of gas permeable hollow yarns, while supplying a cleaning gas thereto from a gas reservoir, thereby providing a cleaning fluid; and
   supplying said cleaning fluid to said cleaning vessel through a supply line.

2. The method for cleaning semiconductor wafers according to claim 1, wherein said cleaning gas is dissolved in said deionized water by said mixer.

3. The method for cleaning semiconductor wafers according to claim 1, wherein said cleaning vessel, said mixer and said gas reservoir are disposed in the same housing.

4. The method for cleaning semiconductor wafers according to claim 1, wherein said cleaning gas is selected from a hydrogen fluoride gas, a hydrogen chloride gas, an ammonia gas, a chlorine gas, a fluorine gas, a sulfurous acid gas, an ozone gas and a nitrous acid gas.

5. The method for cleaning semiconductor wafers according to claim 1, wherein different kinds of cleaning fluids are subsequently supplied to said cleaning vessel by exchanging cleaning gases supplied to said mixer.

6. The method for cleaning semiconductor wafers according to claim 1, wherein said deionized water is only supplied to said cleaning vessel through said supply line to rinse said plurality of semiconductor wafers after treating them with said cleaning fluid.

7. The method for cleaning semiconductor wafers according to claim 1, wherein said cleaning fluid is supplied to a plurality of cleaning vessels at the same time.

8. The method for cleaning semiconductor wafers according to claim 1, wherein said deionized water is supplied to said cleaning vessel through a separate supply line to rinse said plurality of semiconductor wafers after treating them with said cleaning fluid.

* * * * *